(12) United States Patent
Woo

(10) Patent No.: US 11,887,861 B2
(45) Date of Patent: Jan. 30, 2024

(54) SUBSTRATE PROCESSING METHOD AND SUBSTRATE PROCESSING APPARATUS

(71) Applicant: Tokyo Electron Limited, Tokyo (JP)

(72) Inventor: Jaewon Woo, Gyeonggi-do (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 141 days.

(21) Appl. No.: 17/151,421

(22) Filed: Jan. 18, 2021

(65) Prior Publication Data
US 2021/0230750 A1 Jul. 29, 2021

(30) Foreign Application Priority Data
Jan. 24, 2020 (JP) .................................. 2020-010284

(51) Int. Cl.
*H01L 21/311* (2006.01)
*H01L 21/02* (2006.01)

(52) U.S. Cl.
CPC .... *H01L 21/31116* (2013.01); *H01L 21/0217* (2013.01); *H01L 21/02164* (2013.01); *H01L 21/02271* (2013.01); *H01L 21/02321* (2013.01); *H01L 21/02332* (2013.01); *H01L 21/02337* (2013.01); *H01L 21/02359* (2013.01)

(58) Field of Classification Search
None
See application file for complete search history.

(56) References Cited

U.S. PATENT DOCUMENTS

| | | | | |
|---|---|---|---|---|
| 9,064,812 | B2 * | 6/2015 | Kim | .................... H01L 21/3083 |
| 9,520,302 | B2 * | 12/2016 | Ko | .................... H01L 29/66795 |
| 2015/0072508 | A1 * | 3/2015 | Or | .................... H01L 21/02057 |
| | | | | 438/466 |
| 2016/0005621 | A1 * | 1/2016 | Toda | .................... H01L 21/67109 |
| | | | | 156/345.24 |
| 2016/0133459 | A1 * | 5/2016 | Ko | .................... H01L 21/31116 |
| | | | | 438/759 |
| 2016/0236244 | A1 * | 8/2016 | Takahashi | .......... H01L 21/0206 |

(Continued)

FOREIGN PATENT DOCUMENTS

JP 5809144 B2 11/2015
JP 6568769 B2 8/2019

*Primary Examiner* — Scott B Geyer
(74) *Attorney, Agent, or Firm* — Nath, Goldberg & Meyer; Jerald L. Meyer; Tanya E. Harkins

(57) ABSTRACT

A method of processing a substrate, includes: loading the substrate having a silicon-containing film formed thereon into a processing container; a first process of modifying the silicon-containing film by supplying a processing gas containing a halogen-containing gas and a basic gas to the substrate, in a state in which an internal pressure of the processing container is set to a first pressure, to generate a reaction product; a second process of vaporizing the reaction product by setting the internal pressure of the processing container to a second pressure lower than the first pressure; and alternately repeating the modifying the silicon-containing film and the vaporizing the reaction product, wherein subsequent rounds of the first process following the initial first process in the alternately repeating the modifying the silicon-containing film and the vaporizing the reaction product includes supplying the processing gas to the substrate on which the reaction product remains.

7 Claims, 13 Drawing Sheets

(56) References Cited

U.S. PATENT DOCUMENTS

2017/0294319 A1* 10/2017 Ogiwara ........... H01L 21/67069
2018/0330962 A1* 11/2018 Tomita .............. H01L 21/67207
2020/0194257 A1*  6/2020 Hisamatsu ........ H01L 21/31116

* cited by examiner

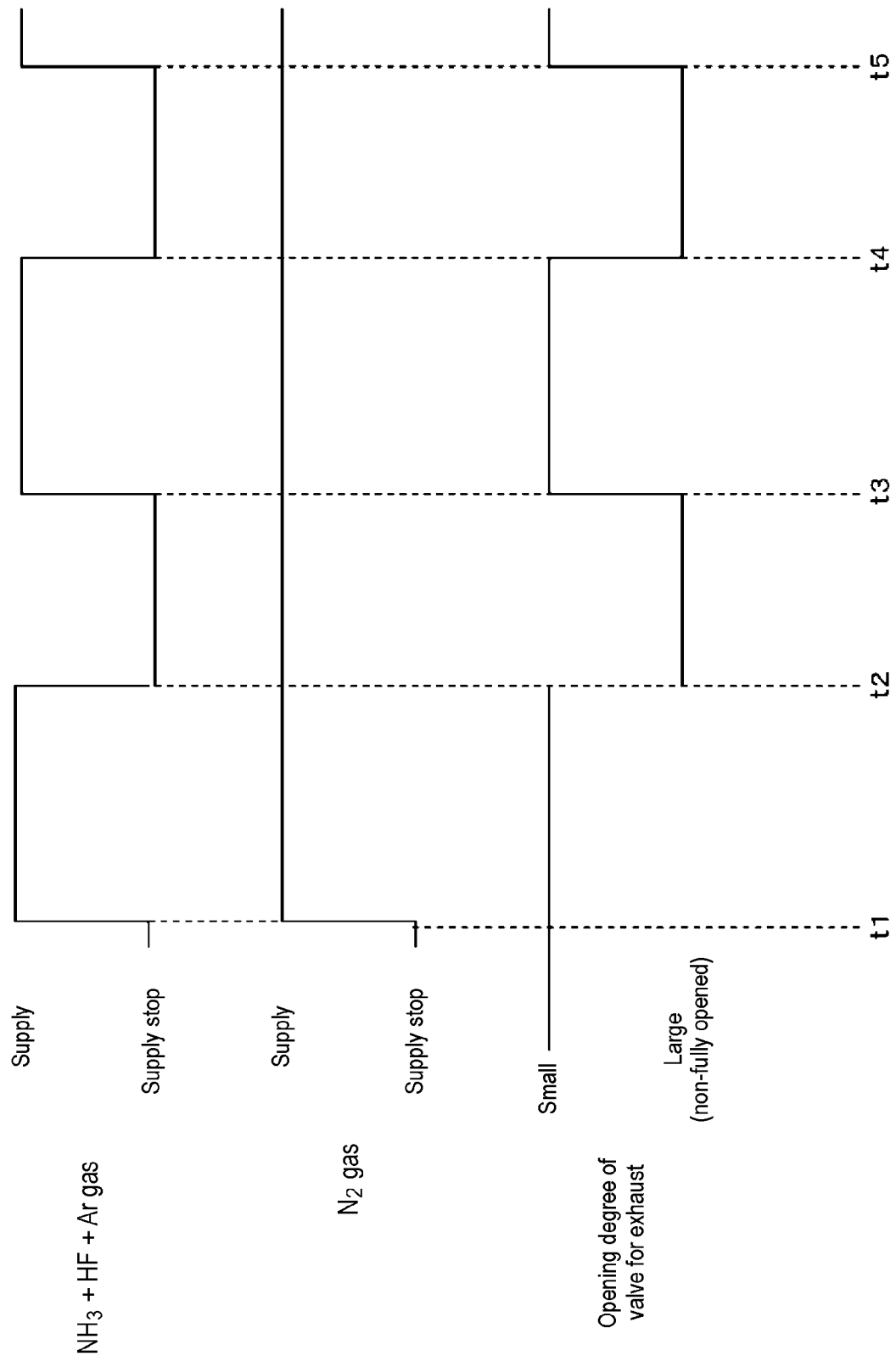

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2020-010284, filed on Jan. 24, 2020, the entire contents of which are incorporated herein by reference.

TECHNICAL FIELD

The present disclosure relates to a substrate processing method and a substrate processing apparatus.

BACKGROUND

In manufacturing a semiconductor device, etching of a silicon-containing film such as a silicon oxide film ($SiO_2$ film) or the like formed on a surface of a semiconductor wafer (hereinafter, referred to as a "wafer") as a substrate is often carried out. Patent Documents 1 and 2 disclose a process called chemical oxide removal (COR) as a method for etching the $SiO_2$ film. More specifically, Patent Documents 1 and 2 disclose, as the COR process, a process of modifying the $SiO_2$ film with a hydrogen fluoride (HF) gas and an ammonia ($NH_3$) gas and a process of sublimating a reaction product generated by the modification of the $SiO_2$ film by depressurizing the ambient atmosphere of the wafer.

PRIOR ART DOCUMENTS

Patent Documents

Patent Document 1: Japanese patent No. 5809144
Patent Document 2: Japanese patent No. 6568769

SUMMARY

According to one embodiment of the present disclosure, there is provided a method of processing a substrate, the method including: loading the substrate having a silicon-containing film formed thereon into a processing container; a first process of modifying the silicon-containing film by supplying a processing gas containing a halogen-containing gas and a basic gas to the substrate, in a state in which an internal pressure of the processing container is set to a first pressure, to generate a reaction product; a second process of vaporizing the reaction product by setting the internal pressure of the processing container to a second pressure lower than the first pressure; and alternately repeating the modifying the silicon-containing film and the vaporizing the reaction product, wherein a second-round of first process and subsequent rounds of the first process following the initial first process in the alternately repeating the modifying the silicon-containing film and the vaporizing the reaction product includes supplying the processing gas to the substrate on which the reaction product remains.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a timing chart illustrating a supply of each gas performed by the substrate processing apparatus and a change in an opening degree of a valve.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

A substrate processing apparatus 1 according to an embodiment of the present disclosure will be described with reference to a longitudinal sectional view of FIG. 1. The substrate processing apparatus 1 is an apparatus which accommodates a wafer W having a $SiO_2$ film formed thereon inside a processing container 11 kept in a vacuum atmosphere and etches the $SiO_2$ film by the COR process as described in the Background section of the present disclosure. More specifically, the substrate processing apparatus 1 performs a process of modifying the $SiO_2$ film by supplying an HF gas and an $NH_3$ gas as a processing gas to the wafer W to generate a reaction product, and a process of stopping the supply of the processing gas to sublimate the reaction product, so as to remove the $SiO_2$ film. The reaction product described above is ammonia fluorosilicate (AFS).

For the sake of convenience in description, a period in which the processing gas is supplied is defined as a first period, and a period in which the supply of the processing gas is stopped to sublimate the AFS is defined as a second period. In processing one sheet of wafer W, the first period and the second period are alternately repeated. In order to perform the sublimation of the AFS, an internal pressure of the processing container 11 is lower in the second period than in the first period.

Figure 1:
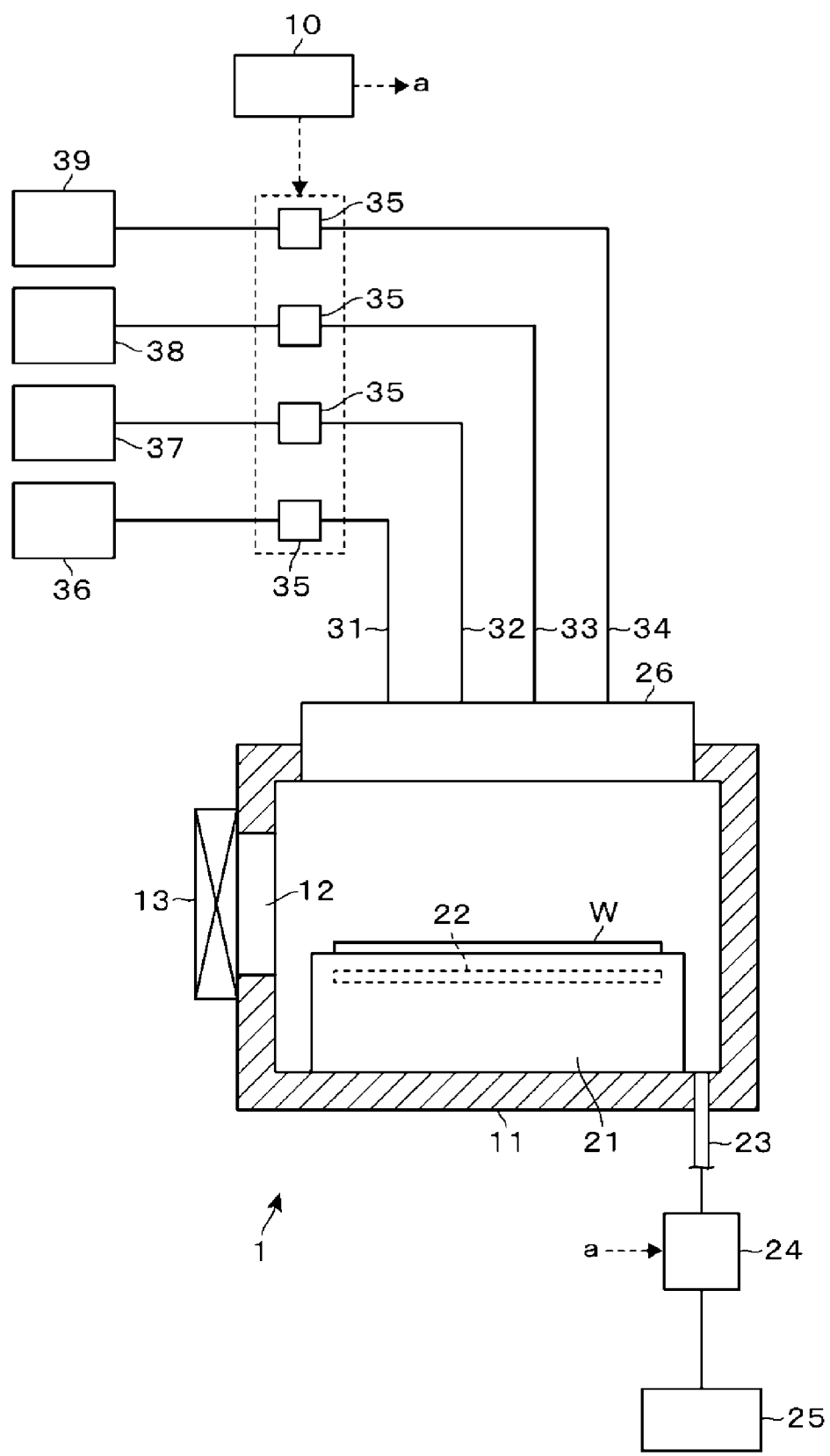
FIG. 1 is a longitudinal sectional view of a substrate processing apparatus for performing substrate processing according to an embodiment of the present disclosure.

In FIG. 1, reference numeral 12 denotes a transfer port for the wafer W which is opened in a sidewall of the processing container 11, and is opened and closed by a gate valve 13. A stage 21 on which the wafer W is placed is provided inside the processing container 11. The wafer W is loaded into and unloaded from the processing container 11 via the transfer port 12 by a transfer mechanism (not shown). In addition, elevating pins (not shown) are provided in the stage 21 so that the wafer W can be transferred between the transfer mechanism that has entered the processing container 11 and the stage 21.

A heating part 22 is embedded in the stage 21 so as to heat the wafer W placed on the stage 21 to, for example, 80 degrees C. or higher, more specifically, for example, 100 degrees C. The heating part 22 is configured as a flow passage constituting a portion of a circulation passage through which a fluid for temperature adjustment such as water or the like flows, so that the wafer W is heated by heat exchange with the fluid. However, the heating part 22 is not limited to such a flow passage of the fluid but may be configured by, for example, a heater which is a resistance heating body. Furthermore, for example, the wafer W is heated so as to have the same temperature in the first period and the second period, and the sublimation of the AFS described above is caused not by the temperature change of the wafer W but by the pressure change in the processing container 11 as described above.

In addition, one end of an exhaust pipe 23 is opened in the processing container 11, and the other end of the exhaust pipe 23 is connected to an exhaust mechanism 25 including, for example, a vacuum pump, via a valve 24 which is a pressure changing mechanism. An amount of gas exhausted from the processing container 11 is adjusted by changing an opening degree of the valve 24. As a result, the internal pressure of the processing container 11 is adjusted. Thus, the opening degree of the valve 24 becomes larger in the second period described above than in the first period.

A gas shower head 26, which is a processing gas supply mechanism, is provided at an upper portion of the processing container 11 so as to face the stage 21. Downstream sides of gas supply passages 31 to 34 are connected to the gas shower head 26, and upstream sides of the gas supply passages 31 to 34 are connected to gas sources 36 to 39 via respective flow rate adjusting parts 35. Each of the flow rate adjusting parts 35 includes a valve and a mass flow controller. Gases supplied from the gas sources 36 to 39 are supplied or not supplied to the downstream side by opening or closing the valves included in the respective flow rate adjusting parts 35.

An HF gas which is a halogen-containing gas, an $NH_3$ gas which is a basic gas, an argon (Ar) gas, and a nitrogen ($N_2$) gas are supplied from the gas sources 36, 37, 38, and 39, respectively. Therefore, the HF gas, the $NH_3$ gas, the Ar gas, and the $N_2$ gas can be respectively supplied from the gas shower head 26 into the processing container 11. The Ar gas and the $N_2$ gas are supplied into the processing container 11 as a carrier gas together with the HF gas and the $NH_3$ gas in the first period. Furthermore, the $N_2$ gas is supplied into the processing container 11 as a purge gas for purging the interior of the processing container 11 also in the second period.

The substrate processing apparatus 1 includes a controller 10 which is a computer. The controller 10 has a program. This program is stored in a non-transitory computer-readable storage medium such as a compact disc, a hard disk, a magneto-optical disc, a DVD or the like, and is installed on the controller 10. The controller 10 outputs a control signal to each part of the substrate processing apparatus 1 by the program to control the operation of each part. Specifically, the opening degree of the valve 24 of the exhaust pipe 23, the opening/closing operation of the valves constituting the flow rate adjusting parts 35, and the like are controlled by the program. The aforementioned program incorporates a group of steps so as to control the operation of each part in this way and to perform processing as described later.

FIG. 2 is a chart diagram illustrating a timing when a state where the supply of each gas into the processing container 11 is performed and a state where the supply of each gas is stopped are switched when the wafer W is processed by the substrate processing apparatus 1, and a timing when the opening degree of the valve 24 is changed. As described above, in the substrate processing apparatus 1, the processing is performed so that the first period in which the processing gas is supplied to the wafer W and the second period in which the AFS is sublimated by lowering the internal pressure of the processing container 11 more than in the first period are alternately repeated. A processing performed in the first period is referred to as a first step, a processing performed in the second period is referred to as a second step. A step of repeating the first step and the second step is performed. The valve 24 is not fully opened in each second period, and therefore the interior of the processing container 11 has a relatively low exhaust amount and a relatively high pressure in the second period. The reason why the opening degree of the valve 24 is limited in this way will be described below together with a series of processing performed on the wafer W. Times t1 to t2 and t3 to t4 indicated in the chart diagram are the first period, and times t2 to t3 and t4 to t5 are the second period.

Figure 3A:
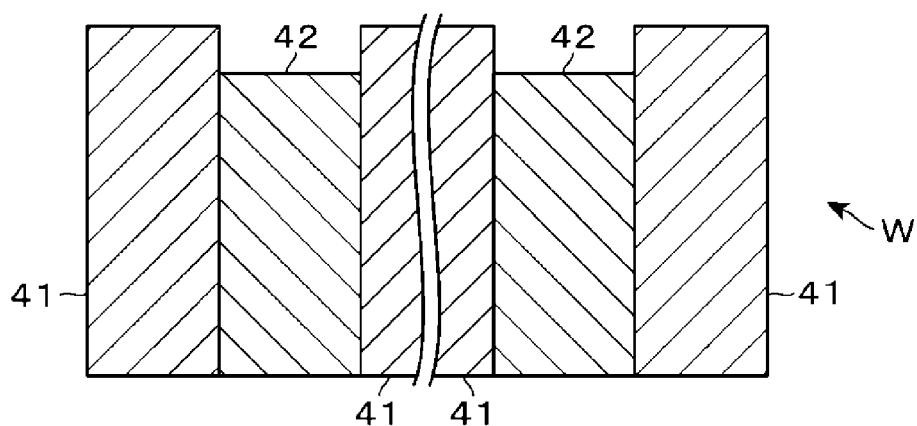
FIG. 3A is a schematic view illustrating a surface of a wafer processed by the substrate processing apparatus.

The processing performed on the wafer W will be described with reference to FIG. 2 described above and FIGS. 3A to 6. FIGS. 3A to 6 are longitudinal sectional views of a surface of the wafer W. In each figure, a central portion of the wafer W is indicated on the left side, and a peripheral portion of the wafer W is indicated on the right side. FIG. 3A illustrates the wafer W before processing by the substrate processing apparatus 1. For example, a plurality of convex portions each being formed of a polysilicon film 41 are arranged in a transverse direction, and $SiO_2$ films 42 are formed to fill spaces between the respective convex portions. The substrate processing apparatus 1 etches the $SiO_2$ films 42 so that the lower end portion thereof remains. Furthermore, in each figure, the processing gas (the HF gas and the $NH_3$ gas) is indicated as reference numeral 43. For example, the concentration of the processing gas 43 at the time of supplying the processing gas 43 is deviated between the central portion and the peripheral portion of the wafer W due to the characteristics of the apparatus. Here, the concentration of the processing gas 43 is assumed to be set higher in the central portion.

Figure 3B:
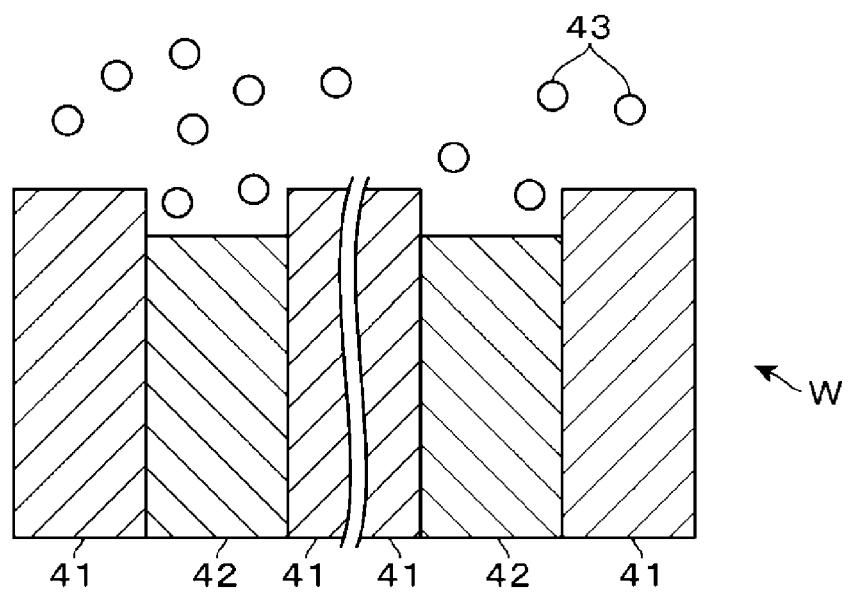
FIG. 3B is a longitudinal sectional view illustrating a surface of the wafer.

The wafer W illustrated in FIG. 3A is loaded into the processing container 11, placed on the stage 21, and heated to the aforementioned temperature. Then, the valve 24 has a first opening degree so that the interior of the processing container 11 has a vacuum atmosphere of, for example, 2.6 to 533 Pa, which is a first pressure, and the processing gas 43, the Ar gas and the $N_2$ gas are respectively supplied into the processing container 11 (FIG. 3B, time t1 in FIG. 2).

Figure 3C:
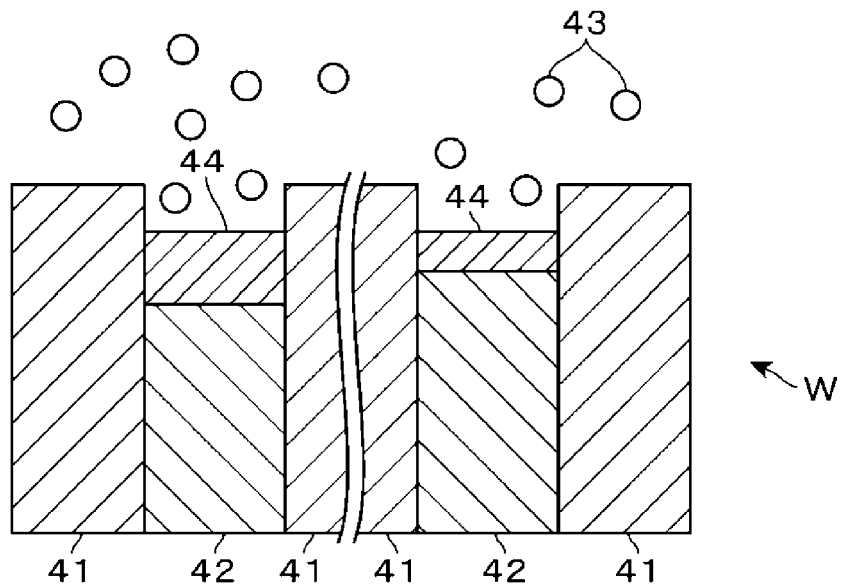
FIG. 3C is a longitudinal sectional view illustrating a surface of the wafer.

The surfaces of the $SiO_2$ films 42 react with the processing gas 43 to generate AFS, so as to form AFS layers 44 (FIG. 3C). Subsequently, the supply of the processing gas 43 and the Ar gas into the processing container 11 is stopped and the opening degree of the valve 24 is increased to become a second opening degree (time t2), and the internal pressure of the processing container 11 is lowered to, for example, 0 to 200 Pa, which is a second pressure. Furthermore, the second opening degree is an opening degree which is not in the fully open condition as described above.

Figure 4A:
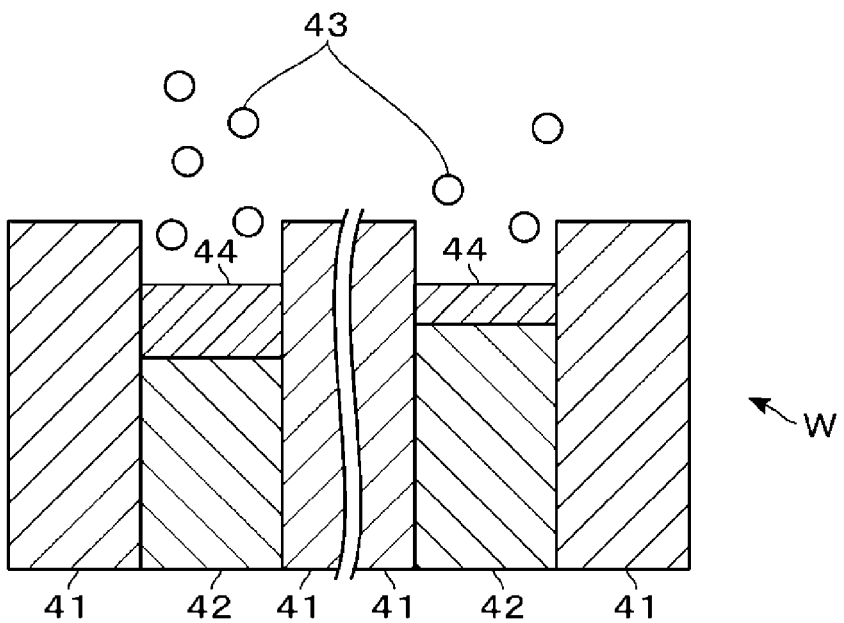
FIG. 4A is a longitudinal sectional view illustrating a surface of the wafer.
Figure 4B:
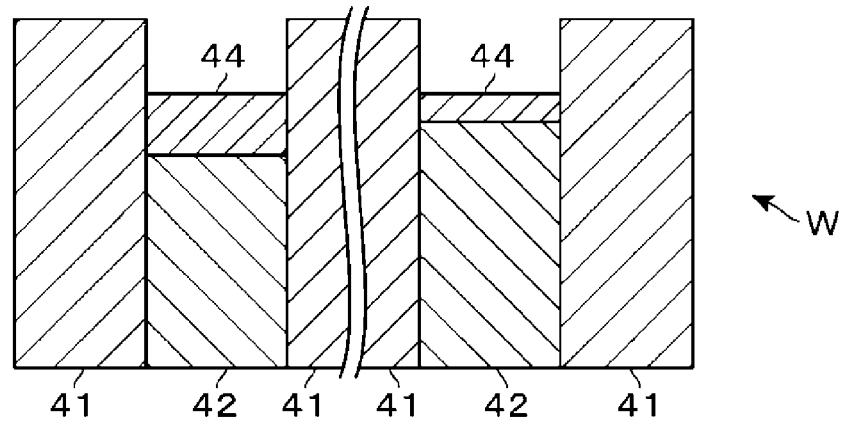
FIG. 4B is a longitudinal sectional view illustrating a surface of the wafer.
Figure 4C:
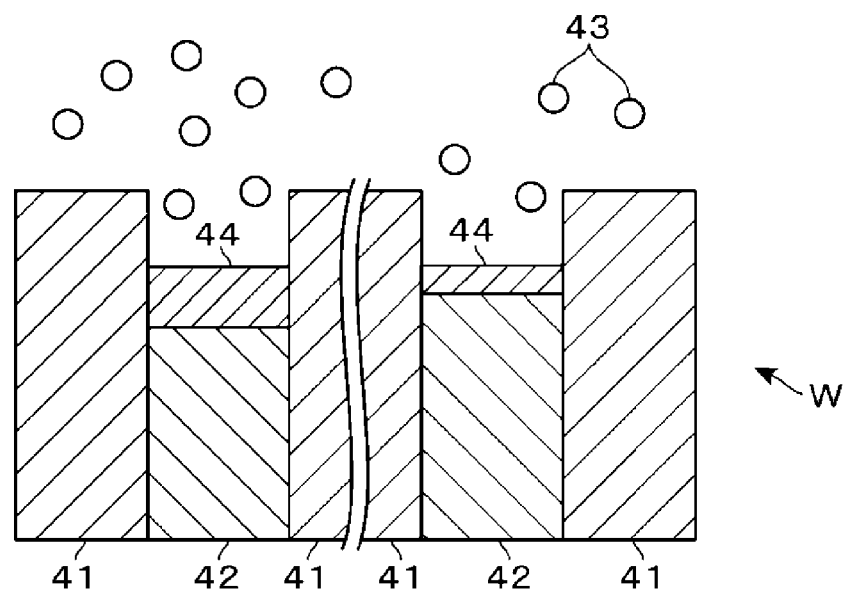
FIG. 4C is a longitudinal sectional view illustrating a surface of the wafer.

It is assumed that, due to the deviation of the concentration of the processing gas 43, the reaction amount with the processing gas 43 is larger in the central portion of the wafer W than in the peripheral portion at time t2, and thus the AFS layer 44 is formed thicker. Then, after time t2, since the valve 24 is not fully opened and the exhaust amount is suppressed as described above, the processing gas 43 is not purged from the processing container 11 at once but is gradually purged. Furthermore, since the valve 24 is not fully opened and the lowering of the pressure is suppressed, the entire AFS layers 44 can be avoided from being rapidly sublimated and sublimation gradually proceeds from the upper side of the AFS layers 44. While the sublimation proceeds in this way, the processing gas 43 remaining in the processing container 11 passes through the AFS layers 44 and acts on the upper portion of the unreacted $SiO_2$ films 42. Therefore, in each of the central portion and the peripheral portion of the wafer W, the positions of the upper end and the lower end of the AFS layers 44 move downward (the bottom side of the wafer W) (FIG. 4A). When the purge of the processing gas 43 is completed, the generation of new AFS is stopped, while the sublimation further proceeds (FIG. 4B).

Figure 5A:
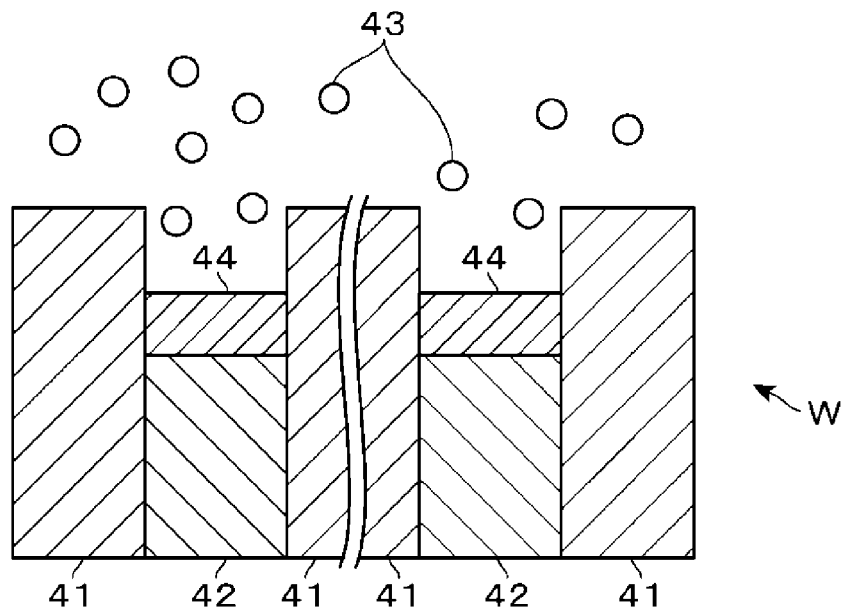
FIG. 5A is a longitudinal sectional view illustrating a surface of the wafer.

Subsequently, the opening degree of the valve 24 is lowered and returned to the first opening degree, the internal pressure of the processing container 11 rises to reach the aforementioned first pressure, and the sublimation of the AFS layers 44 is stopped. As the opening degree of the valve 24 is changed, the supply of the processing gas 43 and the Ar gas into the processing container 11 is resumed (time t3, FIG. 4C). Since the thickness of the AFS layers 44 is larger in the central portion than in the peripheral portion of the wafer W at time t2, the thickness of the AFS layers 44 is also larger in the central portion than in the peripheral portion of the wafer W even at time t3. Then, by the processing gas 43 newly supplied after this time t3, the reaction proceeds in each of the central portion and the peripheral portion of the wafer W to make the AFS layers 44 thicker. When the thickness of the AFS layers 44 exceeds a certain size, the processing gas cannot pass through the AFS layers 44 and thus the reaction does not proceed. In other words, the generation of AFS is saturated. In this manner, the reaction is stopped in the central portion of the wafer W and the increase of the thickness of the AFS layer 44 is stopped. Meanwhile, the reaction continues to proceed in the peripheral portion of the wafer W in which the thickness of the AFS layer 44 is small, and thus the thickness of the AFS layer 44 is increased. Therefore, the thickness of the AFS layers 44 and the height position of the lower end of the AFS layers 44 are aligned between the central portion and the peripheral portion of the wafer W (FIG. 5A).

Figure 5B:
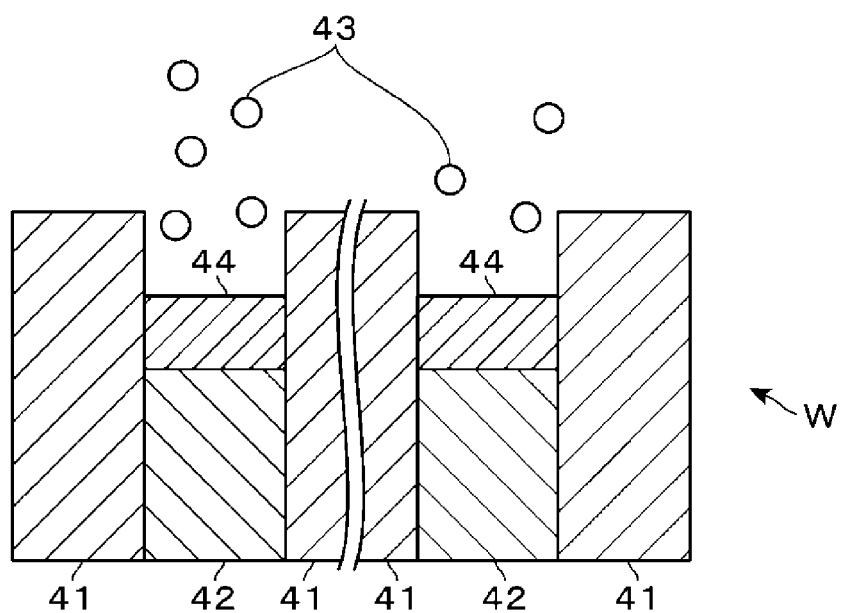
FIG. 5B is a longitudinal sectional view illustrating a surface of the wafer.
Figure 5C:
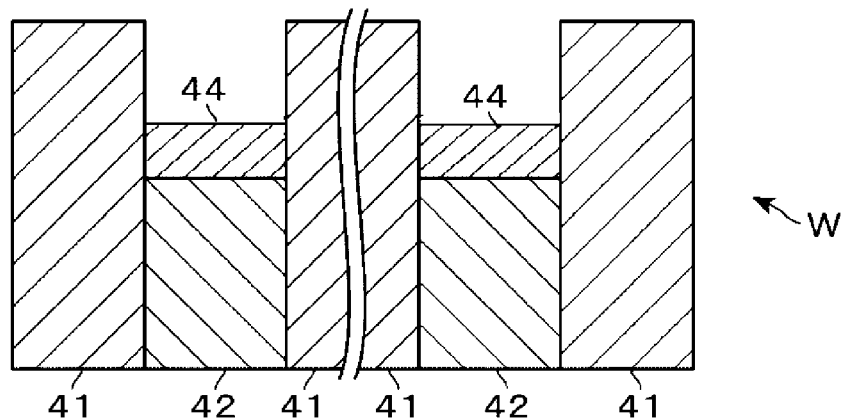
FIG. 5C is a longitudinal sectional view illustrating a surface of the wafer.

Thereafter, the supply of the processing gas 43 and the Ar gas into the processing container 11 is again stopped, the opening degree of the valve 24 is increased to become the second opening degree again (time t4), and the internal pressure of the processing container 11 is lowered to become the aforementioned second pressure. Then, as at times t2 to t3, the generation of AFS by the remaining processing gas 43 and the sublimation of AFS proceed, and the upper end and the lower end of the AFS layers 44 move downward (FIG. 5B). When the purge of the processing gas 43 is completed, the generation of new AFS is stopped and the sublimation proceeds (FIG. 5C).

Thereafter, the opening degree of the valve 24 is lowered to become the first opening degree, and the supply of the processing gas 43 and the Ar gas into the processing container 11 is resumed (time t5). As the sublimation proceeds in the central portion and the peripheral portion of the wafer W at times t4 to t5 and the thickness of the AFS layers 44 is reduced, the reaction with the processing gas 43 proceeds in the central portion and the peripheral portion of the wafer W to increase the thickness of the AFS layers 44.

Subsequently, similar to the above, the switching of the supply and cutoff of the processing gas 43 and the Ar gas and the changing of the opening degree of the valve 24 are repeated, whereby the supply of the processing gas, which is the processing in the first period, and the sublimation, which is the processing in the second period, are repeated and the etching of the $SiO_2$ films 42 proceeds. In the process, even if the thickness of the AFS layer 44 in the central portion becomes larger than the thickness of the AFS layer 44 in the peripheral portion of the wafer W due to the characteristics of the apparatus, the reaction in the central portion of the wafer W when supplying the processing gas 43 is suppressed by the AFS layer 44 whose thickness becomes larger. By suppressing the reaction in this way, the etching of the $SiO_2$ films 42 proceeds between the central portion and the peripheral portion of the wafer W while the thickness and height positions of the AFS layers 44 are aligned. Then, when the processing in the first period and the processing in the second period are respectively performed a preset number of times and the $SiO_2$ films 42 reach a desired thickness (FIG. 6), the wafer W is unloaded from the processing container 11, and the processing is terminated.

Figure 6:
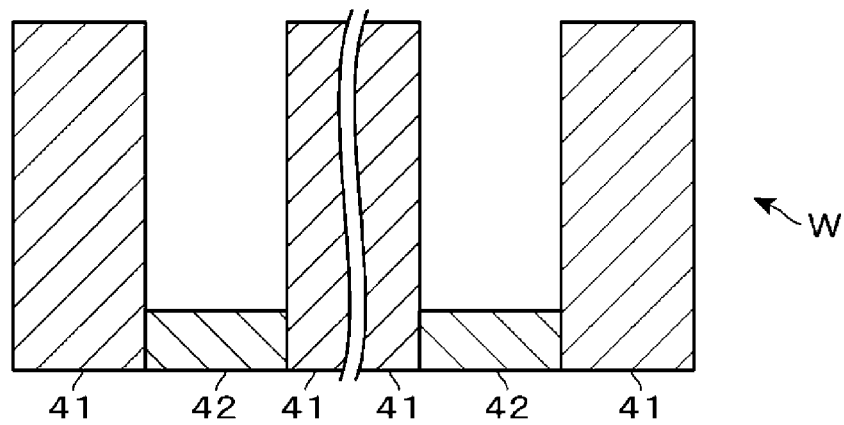
FIG. 6 is a longitudinal sectional view illustrating a surface of the wafer.

For example, the flow rate of the HF gas in the first period is 10 to 550 sccm, the flow rate of the $NH_3$ gas is 10 to 660 sccm, the flow rate of the $N_2$ gas is 0 to 1,000 sccm, and the flow rate of the Ar gas is, for example, 0 to 1,000 sccm. For example, the flow rate of the $N_2$ gas in the second period is 0 to 1,000 sccm. In addition, for example, in order to completely remove the AFS layers 44 as illustrated in FIG. 6, the last second period of the repeated second periods may be set longer than the other second periods. That is, for example, the lengths of the second periods other than the last second period may be set identical to each other, and the length of the last second period alone may be set different from the other second periods. Furthermore, for example, the lengths of the first periods are the same. In addition, in order to completely remove the AFS layers 44, the opening degree of the valve 24 in the last second period may be set larger than the opening degree of the valve 24 in the other second periods.

Meanwhile, in order to quickly start a next-round of first period after the end of the first period when repeating the first period and the second period as described above, it may be considered that the valve 24 is fully opened in the second period to increase the exhaust amount and lower the internal pressure of the processing container 11. That is, it may be considered to exhaust the interior of the processing container 11 so that the period during which the processing gas 43 is not supplied is shortened. However, in such processing, since the processing gas 43 and the AFS layers 44 are quickly removed at the start of the second period, the variation in the amount of AFS in the plane of the wafer W, which may occur in the first period as described above, is not eliminated. Therefore, the etching amount of the $SiO_2$ films 42 varies in the plane of the wafer W after the etching is completed.

However, according to the processing of the substrate processing apparatus 1 described with reference to FIGS. 3A to 6, the opening degree of the valve 24 in the second period is limited, and the processing gas 43 is supplied to the wafer W, with the AFS layers 44 remaining on the $SiO_2$ films 42 in the second-round first period and subsequent first periods. At that time, the amount of newly generated AFS is adjusted according to the thickness of the AFS layers 44 remaining on the surface of the wafer W. Therefore, at the end of the processing of the wafer W, as illustrated in FIG. 6, the $SiO_2$ films 42 are etched with high uniformity in each portion in the plane of the wafer W, and the heights of the remaining $SiO_2$ films 42 are aligned in each portion in the plane.

Furthermore, in describing this processing, a case where the processing gas is supplied so that the amount of AFS generated in the peripheral portion, between the central portion and the peripheral portion of the wafer W in the first period, becomes smaller has been described as an example. However, as described above, since the amount of newly generated AFS is adjusted according to the thickness of the AFS layers 44 remaining on the wafer W, the variation in the etching amount of the $SiO_2$ films 42 can be suppressed by this processing even when the processing gas is supplied so that the amount of AFS generated in the central portion is smaller than that in the peripheral portion. Furthermore, the uniformity of the etching amount can be implemented in each portion in the plane of the wafer W without being limited between the central portion and the peripheral portion.

In addition, when the valve 24 is fully opened in the second period, a difference occurs in the exhaust amount due to a variation in performance between a plurality of substrate processing apparatuses 1, and therefore the sublimation amount of AFS may vary between the substrate processing apparatuses 1. However, the valve 24 in the second period is not fully opened in each substrate processing apparatus 1 so that the AFS layers 44 remain during the second period performed by the substrate processing apparatus 1 as described above. That is, by setting the opening degree of the valve 24 in the second period to an appropriate opening degree for each substrate processing apparatus 1, the uniformity of processing between the apparatuses can be improved. Furthermore, according to the aforementioned processing, the processing gas 43 remains for a relatively long time even in the second period when the supply of the processing gas is stopped, generating AFS. Thus, it is possible to promote the improvement of throughput.

Moreover, in the aforementioned processing example, for the sake of convenience in description, the increase in the thickness of the AFS layers 44 has been described to be stopped in the second-round of first period. However, the processing may be performed so that the increase in the thickness of the AFS layers 44 is stopped in a third-round of first period and subsequent first periods. Furthermore, although there has been described the example in which the AFS remains on the wafer W in each of the second-round of first period and subsequent first periods, the AFS may not remain in the wafer W every time. For example, when processing one sheet of wafer W, if the number of first periods is assumed to be 10, the opening degree of the valve 24 in each second period may be controlled so that the processing is performed in a state where no AFS remains in the wafer W in the five first periods in the former half and AFS remains in the wafer W in the five first periods in the second half.

Second Embodiment

Figure 7A:
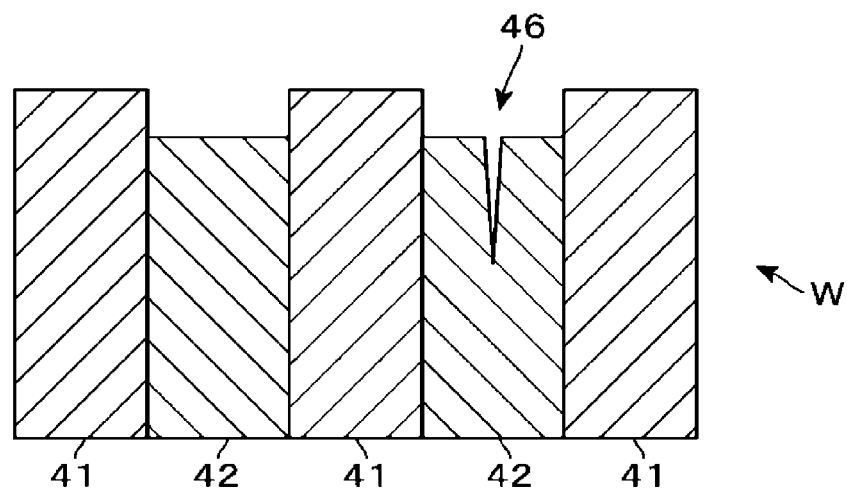
FIG. 7A is a schematic view illustrating a surface of a wafer processed by the substrate processing apparatus.

Next, a second embodiment of the present disclosure will be described with a focus on differences from the first embodiment. In the second embodiment, processing is performed so that the length of each of the second periods is relatively short. As illustrated in FIG. 7A, a $SiO_2$ film 42 of a wafer W processed in the second embodiment has a seam 46 formed as a crack from its surface to the lower side (the bottom side of the wafer W).

As described above, the second period is set relatively short in the second embodiment. Meanwhile, in a comparative example which will be described later, the second period is set relatively long in order to clearly describe operational effects of the second embodiment. Further, in the comparative example, it is assumed that the opening degree of the valve 24 in the second period is relatively large.

However, the surfaces of the wafer W processed in the second embodiment and the comparative example thereof are illustrated in FIGS. 7A to 9C. In each figure, unlike the figures illustrating the surfaces of the wafer W in the first embodiment, solid AFS (corresponding to the AFS layers 44 described in the first embodiment), and gaseous AFS, which exists at a relatively high concentration around the solid AFS are indicated as reference numeral 47. That is, in FIGS. 7A to 9C, the gaseous AFS, which was not indicated in the first embodiment, is also illustrated without being distinguished from the solid AFS.

Figure 7B:
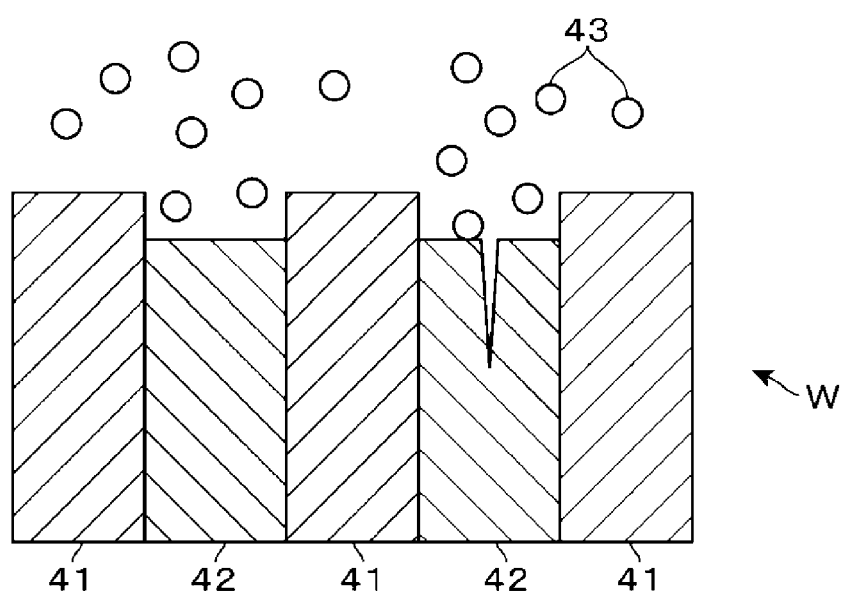
FIG. 7B is a longitudinal sectional view illustrating a surface of the wafer.

Hereinafter, processing of the comparative example will be described. The wafer W illustrated in FIG. 7A is placed on the stage 21 in the processing container 11 and heated in the same manner as in the first embodiment, and the processing gas 43 (the HF gas and the $NH_3$ gas), the Ar gas, and the $N_2$ gas are supplied into the processing container 11 (FIG. 7B). That is, the first period described above starts, in which the $SiO_2$ film 42 is modified by the processing gas 43 to generate AFS 47. The processing gas 43 enters the seam 46, and the surface of the peripheral wall of the seam 46 also becomes AFS 47.

Figure 7C:
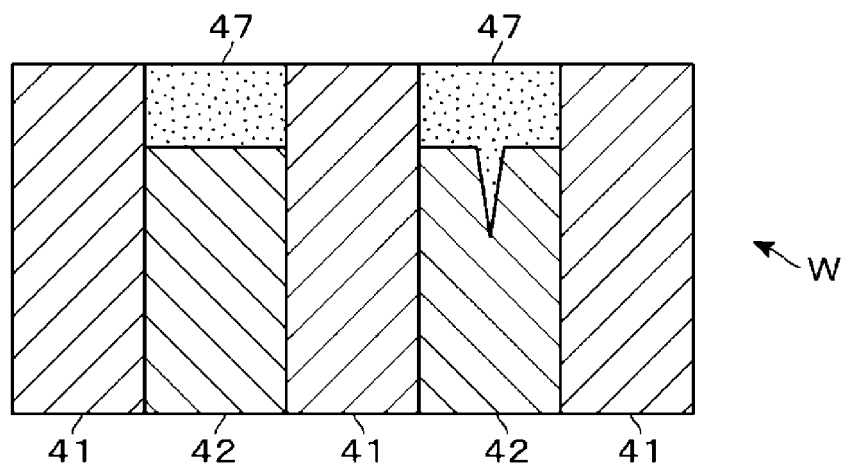
FIG. 7C is a longitudinal sectional view illustrating a surface of the wafer.

After the AFS 47 is generated in this way, the opening degree of the valve 24 is changed from the first opening degree to the second opening degree, and the supply of the HF gas, the $NH_3$ gas and the Ar gas is stopped. That is, the second period starts, in which the sublimation of the AFS 47 proceeds (FIG. 7C). As already described above, since the second period is relatively long in the comparative example, the AFS 47 is removed from the wafer W until the second period ends, Therefore, the peripheral wall of the seam 46, which has become the AFS 47, is also removed to expand the width of the seam 46.

Figure 8A:
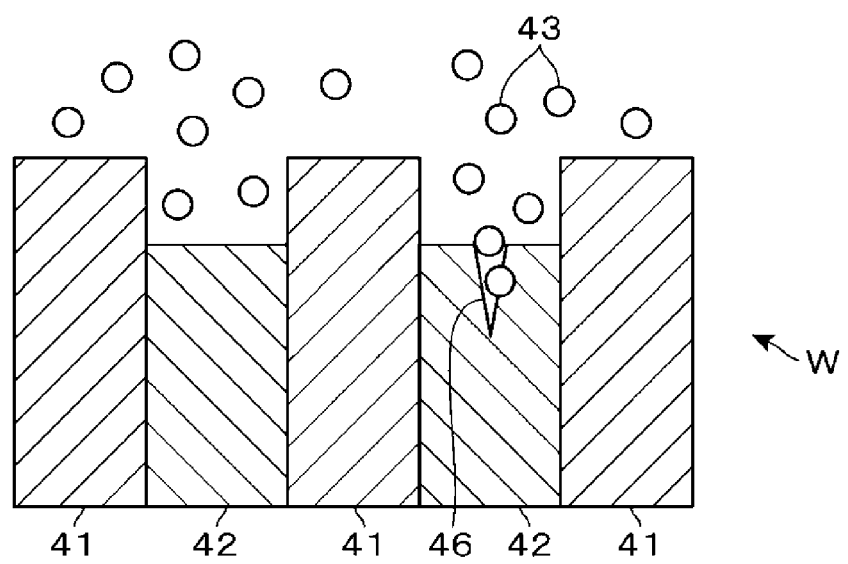
FIG. 8A is a longitudinal sectional view illustrating a surface of the wafer.
Figure 8B:
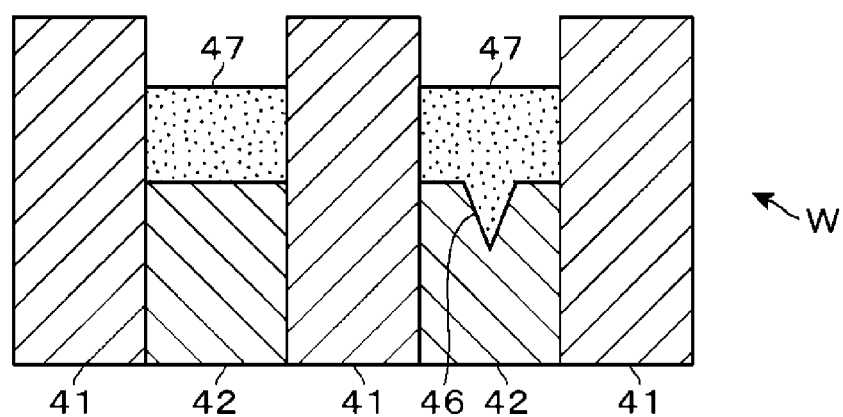
FIG. 8B is a longitudinal sectional view illustrating a surface of the wafer.
Figure 8C:
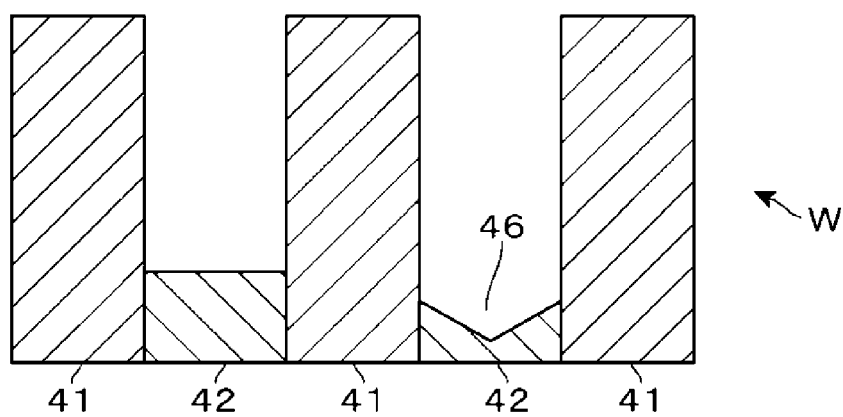
FIG. 8C is a longitudinal sectional view illustrating a surface of the wafer.

Thereafter, the first period restarts, in which the modification of the SiO$_2$ film 42 to the AFS 47 by the processing gas 43 proceeds. At this time, as in the first-round of first period, the processing gas 43 enters the seam 46 (FIG. 8A), and the surface of the peripheral wall of the seam 46 becomes the AFS 47 (FIG. 8B). Thereafter, the second period restarts, in which the AFS 47 is removed as in the first-round of second period. Therefore, as in the first-round of second period, the width of the seam 46 is further expanded. Even thereafter, the first period and the second period are repeated. The width of the seam 46 is expanded each time the first period and the second period are passed in this way. FIG. 8C illustrates the wafer W at the end of etching. As illustrated in FIG. 8C, as a result of the expansion of the seam 46, there is a difference in the thickness of the remaining SiO$_2$ films 42 between a portion where the seam 46 was formed and a portion where the seam 46 was not formed before the processing. That is, in the processing of the comparative example, the uniformity of the processing in the plane of the wafer W is lowered.

Subsequently, the processing of the second embodiment will be described with reference to FIGS. 9A to 9C. First, as in the comparative example, the first period starts, in which each gas containing the processing gas 43 is supplied to the wafer W, as illustrated in FIGS. 7A and 7B, and the surface of the SiO$_2$ films 42 is modified to become AFS 47. Thereafter, the second period starts, in which the sublimation of the AFS 47 proceeds as illustrated in FIG. 7C. Since the time of this second period is short and the first period quickly restarts after the end of the first-round of first period, the AFS 47 remains on the surface of the wafer W when the respective first period restarts. More specifically, the solid AFS 47, which was not vaporized in the second period, the AFS 47 which was vaporized but returned to solid due to the increase in the internal pressure of the processing container 11 by the restart of the first period without not removed from the surface of the SiO$_2$ films 42, remains on the surface of the SiO$_2$ films 42. At this time, the inside of the seam 46 is filled with the AFS 47, which has become solid after vaporization as described above.

Figure 9A:
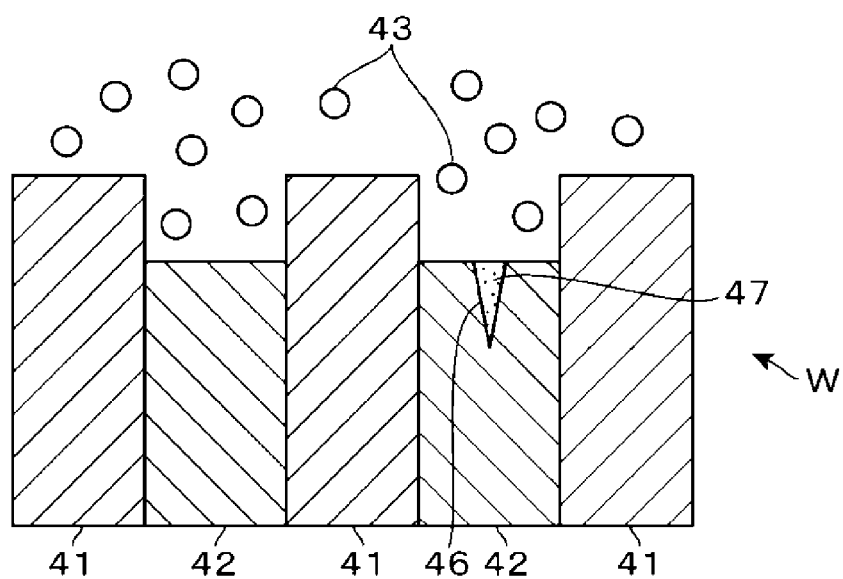
FIG. 9A is a longitudinal sectional view illustrating the surface of the wafer.
Figure 9B:
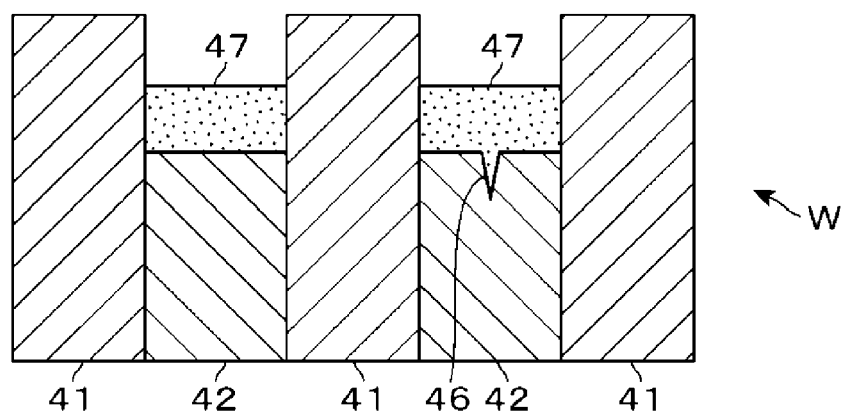
FIG. 9B is a longitudinal sectional view illustrating a surface of the wafer.
Figure 9C:
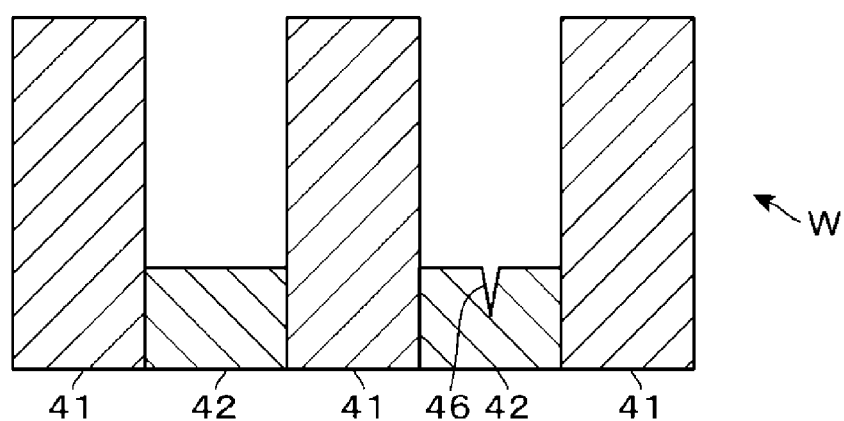
FIG. 9C is a longitudinal sectional view illustrating a surface of the wafer.

Then, the surface of the SiO$_2$ films 42 is changed to the AFS 47 by the processing gas 43 supplied in the second-round of first period (FIG. 9A). However, since the AFS 47 exists in the seam 46, the entry of the processing gas 43 into the seam 46 is suppressed (FIG. 9B). Thereafter, the first period and the second period are repeated. In each first period, the entry of the processing gas 43 into the seam 46 is suppressed as in the second-round of first period. Therefore, the etching of the SiO$_2$ films 42 proceeds while suppressing the expansion of the seam 46. FIG. 9C illustrates the wafer W at the end of etching. As a result of suppressing the expansion of the seam 46 as described above, the difference in the thickness of the remaining SiO$_2$ films 42 between the portion where the seam 46 was formed before the processing and the portion where the seam 46 was not formed before the processing is suppressed, as illustrated in FIG. 9C. That is, the processing is performed with high uniformity in the plane of the wafer W.

In the second embodiment, the AFS 47 may remain on the surface of the wafer W in the second-round of first period and subsequent first periods, and the valve 24 in the second period may be fully opened, or may not be fully opened as in the first embodiment. Furthermore, the AFS 47 may remain on the surface of the wafer W in the second-round of first period and subsequent first periods by setting the opening degree of the valve 24 relatively small, instead of lengthening the second period. In addition, the AFS 47 has been described to remain during each of the second-round of first period and subsequent first periods. That is, it has been described that the AFS 47 remains during the plurality of first periods. In some embodiments, the length of the second period or the opening degree of the valve 24 may be controlled so that the AFS 47 remains in only one first period among the second-round of first period and subsequent first periods. However, it is preferable that the AFS 47 remains in each of the second-round of first period and subsequent first periods from the viewpoint of preventing the expansion of the seam 46.

Meanwhile, in the first embodiment described above, the opening degree of the valve 24 has been described to be controlled so that the AFS remains on the wafer W in the second-round of first period and subsequent first periods. In some embodiments, the AFS may remain by setting the second period relatively short as in the second embodiment. Furthermore, in the first and second embodiments, the silicon-containing film to be etched is not limited to the SiO$_2$ films, but may be, for example, a silicon oxynitride film (SiON film). Even when the SiON film is etched in this way, the AFS may be generated as a reaction product from the SiON film by using the aforementioned processing gas. Therefore, as in the case of etching the SiO$_2$ films, the etching with high uniformity can be performed in the plane of the wafer W. Furthermore, the silicon-containing film may be a silicon nitride film (SiN film). In the case of etching this SiN film, AFS is generated from the SiN film by supplying the NF$_3$ gas, the NH$_3$ gas, and the O$_2$ gas as the processing gas. Thus, the etching with high uniformity can be performed in the plane of the wafer W as in the case of etching the SiO$_2$ films described above.

It should be noted that the embodiments disclosed herein are exemplary in all respects and are not restrictive. The above-described embodiments may be omitted, replaced or modified in various forms without departing from the scope and spirit of the appended claims.

(Evaluation Test)

An evaluation test conducted in connection with the technique of the present disclosure will be described. The etching process described in the first embodiment was performed on a plurality of wafers each having SiO$_2$ films formed on its surface. This etching process was performed by changing the opening degree of the valve 24 in the second period, i.e., the internal pressure of the processing container 11 in the second period, for each wafer W. Then, for each of the processed wafers W, an average value (unit: Å) and uniformity (unit: %) of the etching amount of the SiO$_2$ film in each portion in the plane were measured. The term "uniformity" used herein represents (maximum value of etching amount-minimum value of etching amount)/(average value of etching amount). Therefore, the lower the uniformity value, the higher the uniformity of etching amount in the plane of the wafer W. In this evaluation test, the time of the second period was set to 15 seconds.

Figure 10:
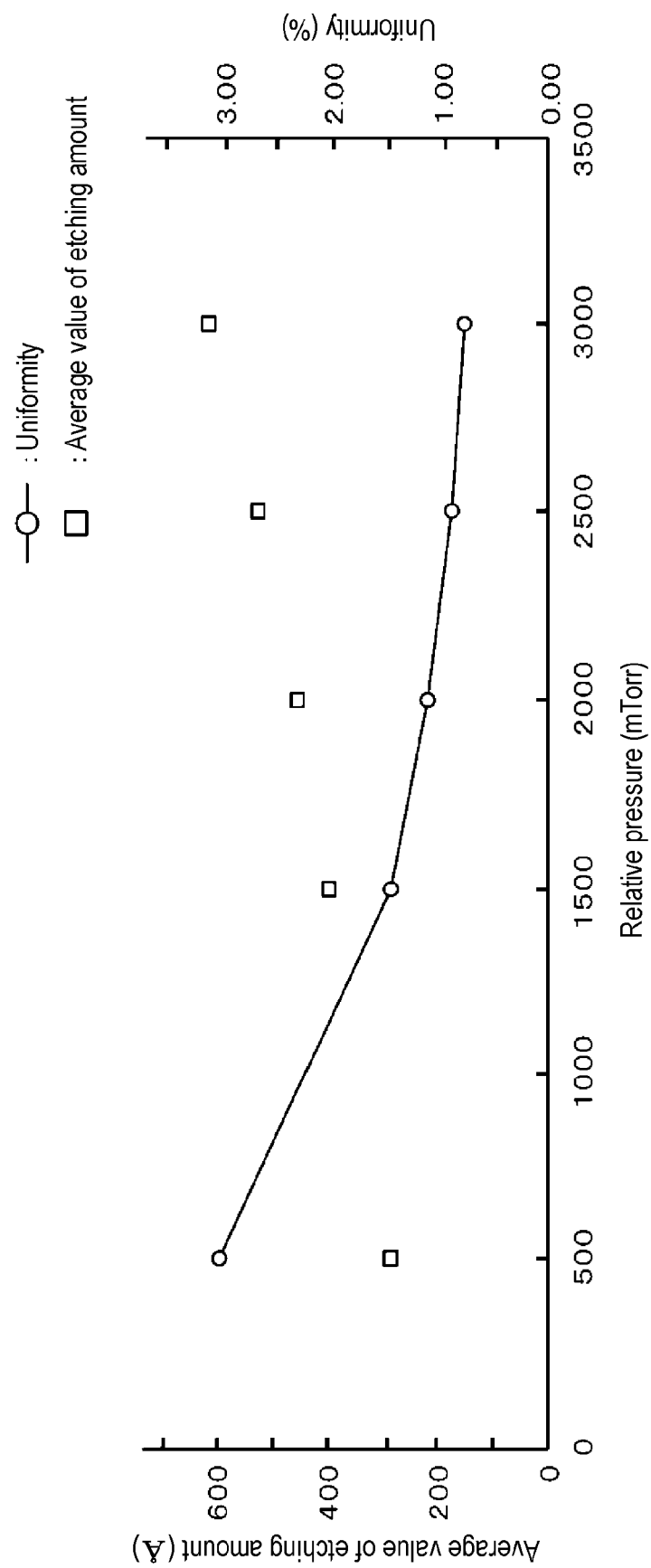
FIG. 10 is a graph illustrating results of an evaluation test.

FIG. 10 is a graph illustrating results of the evaluation test. The vertical axis of the graph indicates an average value (unit: Å) and uniformity (unit: %) of the etching amount, and the horizontal axis of the graph indicates a relative pressure (unit: mTorr) in the processing container 11 in the second period. The relative pressure refers to a relative pressure when a pressure measured when the valve 24 is fully opened is 0 mTorr, and is therefore a pressure difference with respect to the pressure of 0 mTorr. The relative pressure in the first period is 3,000 mTorr (400 Pa). In the graph, the average value of the etching amount is indicated by square points, and the uniformity is indicated by round points. When the relative pressure is 500 mTorr (66.7 Pa), 1,500 mTorr (200 Pa), 2,000 mTorr (267 Pa), 2,500 mTorr (333 Pa), 3,000 mTorr, the average values of etching amount were 290 Å, 407 Å, 458 Å, 524 Å, and 609 Å, respectively. Furthermore, when the relative pressures are 500 mTorr, 1,500 mTorr, 2,000 mTorr, and 2,500 mTorr, the uniformities were 2.59%, 1.23%, 0.98%, 0.76%, and 0.66%, respectively. As described above, the higher the relative pressure in the second period, the higher the uniformity of etching amount in the plane of the wafer W (the lower the uniformity). Moreover, the higher the relative pressure in the second period, the larger the average value of etching amount.

Therefore, from the test results described above, it is presumed that, by controlling the internal pressure of the processing container 11 in the second period, the processing gas is supplied in a state where the AFS layers 44 remain and thus the uniformity of etching is improved as described with reference to FIGS. 3A to 6. Moreover, it is estimated that the higher the relative pressure in the second period, the etching has proceed by the processing gas remaining in the second period. From this evaluation test, it was confirmed that, by using the technique of the present disclosure, it is possible to perform the etching with high uniformity in the plane of the wafer W and to improve the throughput by increasing the etching rate.

Meanwhile, even when the relative pressure is set to 500 mTorr, which is the lowest in the evaluation test, sufficient uniformity and a sufficient average value of etching amount were obtained. That is, a sufficient effect was achieved even when the pressure in the second period is 500 mTorr/3,000 mTorr×100=16.7% with respect to the pressure in the first period. Even when the relative pressure is set slightly lower than 500 mTorr, since the uniformity and the average value of etching amount are expected not to greatly vary, it is preferable that the pressure in the second period is set to 15% or more of the pressure in the first period.

According to the present disclosure in some embodiments, it is possible to perform a removal process with high uniformity in each portion in a plane of a substrate when a silicon-containing film formed on a surface of the substrate is removed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, the method comprising:
    loading the substrate having a silicon-containing film formed thereon into a processing container;
    a first process of modifying the silicon-containing film by supplying a processing gas containing a halogen-containing gas and a basic gas to the substrate, in a state in which an internal pressure of the processing container is set to a first pressure, to generate a reaction product;
    a second process of vaporizing the reaction product by setting the internal pressure of the processing container to a second pressure lower than the first pressure; and
    alternately repeating the first process and the second process,
    wherein in subsequent rounds of the first process following the initial first process in the alternately repeating the first process and the second process, the processing gas is supplied to the substrate on which the reaction product remains.

2. The method of claim 1, wherein the silicon-containing film is a silicon oxide film or a silicon nitride film.

3. The method of claim 2, wherein the silicon-containing film is a silicon oxide film.

4. The method of claim 3, wherein the halogen-containing gas is a hydrogen fluoride gas and the basic gas is an ammonia gas.

5. The method of claim 4, wherein the second pressure is 15% or more of the first pressure.

6. The method of claim 1, wherein the halogen-containing gas is a hydrogen fluoride gas and the basic gas is an ammonia gas.

7. The method of claim 1, wherein the second pressure is 15% or more of the first pressure.

\* \* \* \* \*